US006943125B2

(12) United States Patent
Lee et al.

(10) Patent No.: US 6,943,125 B2
(45) Date of Patent: Sep. 13, 2005

(54) METHOD FOR MANUFACTURING SEMICONDUCTOR DEVICE

(75) Inventors: Ga Won Lee, Ichon-Shi (KR); Jae Hoon Choi, Seoul (KR); Jae Chul Om, Ichon-Shi (KR); Sung Wook Park, Sungnam-Shi (KR); Jae Hee Lee, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/739,248

(22) Filed: Dec. 18, 2003

(65) Prior Publication Data

US 2004/0219799 A1 Nov. 4, 2004

(30) Foreign Application Priority Data

Apr. 30, 2003 (KR) ................. 10-2003-0027680

(51) Int. Cl.⁷ .................. H01L 21/31; H01L 21/469
(52) U.S. Cl. .................. 438/783; 438/958; 438/778
(58) Field of Search ................. 438/597, 623, 438/639, 763, 780, 783, 778, 958, 634

(56) References Cited

U.S. PATENT DOCUMENTS

| | | | | | |
|---|---|---|---|---|---|
| 4,986,841 | A | * | 1/1991 | Oyoshi et al. ............. 65/30.13 |
| 5,418,174 | A | * | 5/1995 | Kalnitsky ................... 438/384 |
| 5,721,601 | A | * | 2/1998 | Yamaji et al. .............. 349/138 |
| 5,892,269 | A | * | 4/1999 | Inoue et al. ................ 257/634 |
| 5,960,300 | A | * | 9/1999 | Yabu et al. ................. 438/436 |
| 5,970,352 | A | * | 10/1999 | Shiozawa et al. ........... 438/300 |
| 6,211,051 | B1 | * | 4/2001 | Jurgensen et al. .......... 438/597 |
| 6,319,849 | B1 | * | 11/2001 | Oda et al. ................... 438/763 |
| 6,479,385 | B1 | * | 11/2002 | Jang et al. .................. 438/691 |
| 6,566,283 | B1 | * | 5/2003 | Pangrle et al. ............. 438/788 |
| 6,599,847 | B1 | * | 7/2003 | Jang et al. .................. 438/787 |
| 6,602,773 | B2 | * | 8/2003 | Lee et al. ................... 438/586 |
| 6,657,229 | B1 | * | 12/2003 | Eguchi et al. ................ 257/67 |
| 6,784,095 | B1 | * | 8/2004 | Pangrle et al. ............. 438/637 |
| 6,838,330 | B2 | * | 1/2005 | Moon et al. ................ 438/230 |

FOREIGN PATENT DOCUMENTS

KR     1998-030940     7/1998

OTHER PUBLICATIONS

B.L. Chin and E.P. van de Ven "Plasma TEOS Process for Interlayer Dielectric Applications" Solid State Technology, Apr. 1988 pp 119–122.*
*A study of Charge Trapping in PECVD PTEOS Films*, Lenahan et al., IEEE Transactions on Nuclear Science, vol. 44, No. 6, pp. 1834–1839, Dec. 1997.
*Defect centers in a pure–silica–core borosilicate–clad optical fiber: ESR studies*, Griscom et al., J. Appl. Phys., vol. 47, No. 3, pp. 960–967, Mar. 1976.
*Fundamental defect centers in glass: Electron spin resonance and optical absorption studies of irradiated phosphorus–doped silica glass and optical fibers*, Griscom et al., J. Appl. Phys. vol. 54, No. 7, pp. 3743–3762, Jul. 1983.

* cited by examiner

*Primary Examiner*—Olik Chaudhuri
*Assistant Examiner*—Michael K. Luhrs
(74) *Attorney, Agent, or Firm*—Marshall, Gerstein & Borun LLP

(57) ABSTRACT

Provided is a method for manufacturing a semiconductor device including a plurality of different semiconductor elements with a transistor for fabricating the semiconductor device formed on a semiconductor substrate, an interlayer insulation film formed all over the upper part, and a hole trap site formed in the interlayer insulation film for preventing a mobile ion like H or moisture from penetrating, whereby it can be prevented that a leakage current increases abnormally where the voltage difference (Vgs) is lower than a threshold voltage.

9 Claims, 5 Drawing Sheets

| Defects | | Description |
|---|---|---|
| $P_1$ | | Phosphorous analogue of E' Center* |
| $P_2$ | | Phosphorous substitution for Silicon |
| $P_4$ | | Doubly coordinated Phosphorous |
| E' | | E' center silicon dangling bond oxygen vacancy trapped hole |

METHOD FOR MANUFACTURING SEMICONDUCTOR DEVICE

BACKGROUND

1. Field of the Invention

The present invention relates to a method for manufacturing a semiconductor device and, more specifically, to a method for manufacturing a semiconductor device capable of preventing a mobile ion or moisture included in an interlayer insulation film from penetrating a semiconductor substrate.

2. Discussion of Related Art

In the process of manufacturing a semiconductor device, electric characteristics of the semiconductor device like a transistor can be deteriorated, when a mobile ion like hydrogen (H) is flowed in.

As a representative example, as shown in FIG. 1, a drain current (Idrain) may be increased abnormally in the region where a voltage is lower than a threshold voltage of a transistor. FIG. 1 is a graph showing the variation of the drain current according to voltage differences (Vgs) between a gate and a source.

Referring to FIG. 1, it is noted that, in the case of the characteristic graph of the transistor having a relatively long channel, an Idrain decreases drastically if Vgs between the gate and the source comes to be lower than a certain voltage. However, in the case of the characteristic graph of the transistor having a relatively short channel, it is also noted that an Idrain flows a lot abnormally, even though Vgs between the gate and the source comes to be lower than a certain voltage. This phenomenon described above is referred to Hump phenomenon, and the Hump phenomenon deteriorates refresh property in a DRAM device, or lowers credibility of the device or brings about inferior goods, by causing a malfunction in a Logic device.

To prevent the Hump phenomenon, as shown in FIG. 2, the penetration of H or moisture can be prevented by a diffusion protection film. FIG. 2 is a cross-sectional view of a transistor in accordance with an embodiment of the prior art.

Referring to FIG. 2, a transistor including a gate oxidation film 203, a gate 204, and a source/drain 205 is formed on a semiconductor substrate 201, conventionally. Subsequently, a diffusion protection film 207 is formed all over the upper part before forming an interlayer insulation film 208, wherein the diffusion protection film prevents H or moisture included in the interlayer insulation film from penetrating the semiconductor substrate. An insulation film spacer 206 is formed on the sidewalls of the gate 204.

Meanwhile, as described in FIG. 2, the upper part of the interlayer insulation film 208 is etched and the diffusion protection film on the upper part of the gate 204 is further etched, so that the upper surface of the gate could be exposed at the time of the subsequent chemical mechanical polishing process for flattening, even though the diffusion protection film 207 is formed between the interlayer insulation film and the transistor. Furthermore, the insulation film spacer 206 conventionally is formed to be a stacked structure having an oxide film and a nitride film, and in a case where the nitride film adjacent to the gate 204 is etched and the oxide film is exposed, the diffusion protection film 207 cannot perform its duty because H (or moisture) penetration path connected to the substrate 201 via the oxidation film of the insulation film spacer 206 from the interlayer insulation film 208 is formed.

For these reasons as described above, a capping layer is formed additionally as shown in FIG. 3, after performing the chemical and mechanical polishing process. FIG. 3 is a cross-sectional view of a transistor in accordance with an embodiment of another conventional art.

Referring to FIG. 3, after forming the interlayer insulation film 208 and performing the chemical and mechanical polishing process, the capping layer 209 is formed to prevent the gate 204 or the insulation film spacer 206 from being exposed. The capping layer 209 is formed as a film including a nitride like SiN.

As a result, as described in FIG. 4, the electrical characteristic of the transistor based on the threshold voltage variation can be improved by forming the capping layer 209. FIG. 4 is a graph showing the threshold voltage variation depending on whether the capping layer exists or not. Referring to FIG. 4, it is noted that the electrical characteristic of the transistor based on the threshold voltage variation is more improved when the capping layer is employed than not.

As described above, although by forming the capping layer including the nitride the electrical characteristic based on the threshold voltage variation can be improved, the problem may be generated that a leakage current characteristic comes to deteriorate. FIG. 5 shows the leakage current characteristic depending on whether the capping layer exists or not.

Referring to FIG. 5, it is noted that a junction leakage current is hardly generated in case of the capping layer not being formed, but generated in case of the capping layer formed.

Therefore, if a diffusion intestinal wall of the capping layer is directly contacted to the semiconductor substrate or the transistor, the junction characteristic deteriorates due to the nitride thereof, or the electrical characteristic of the device deteriorates due to the hot carrier degradation.

SUMMARY OF THE INVENTION

The present invention is directed to a method for manufacturing a semiconductor device. According to a preferred embodiment of the present invention, a plurality of different semiconductor elements including a transistor for fabricating a semiconductor device are formed on a semiconductor substrate; an interlayer insulation film is formed all over the upper part of the semiconductor substrate; a hole trap site is formed in the interlayer insulation film for preventing a mobile ion like H or moisture from penetrating, resulting in being prevented an abnormal increase of a leakage current where the voltage difference (Vgs) is lower than the threshold voltage. Thus, the electric characteristics of the device and the credibility can be improved.

One aspect of the present invention is to provide a method for manufacturing a semiconductor device comprising the steps of; preparing a semiconductor substrate on which a plurality of different semiconductor elements for manufacturing a semiconductor device are formed; forming an interlayer insulation film all over the upper part of the semiconductor substrate; and forming a hole trap site capable of preventing a movable ion or moisture from penetrating the interlayer insulation film. Preferably, the interlayer insulation film is a PE-TEOS film.

Here, a diffusion protection film is formed all over the upper part of the semiconductor substrate, before forming the interlayer insulation film. In addition, the hole trap site is formed by implanting an impurity into said interlayer insulation film and, preferably, the impurity is implanted with a dose in the range of $3E15/cm^2$ to $7E15/cm^2$ with ion implantation energy in the range of 10 keV to 30 keV. Further, the impurity is implanted into the whole surface of the semiconductor substrate including the interlayer insulation film, and the hole trap site is formed in the interlayer insulation. Meanwhile, the impurity is implanted using phosphorous.

DETAILED DESCRIPTION OF PREFERRED EMBODIMENTS

Figure 1:
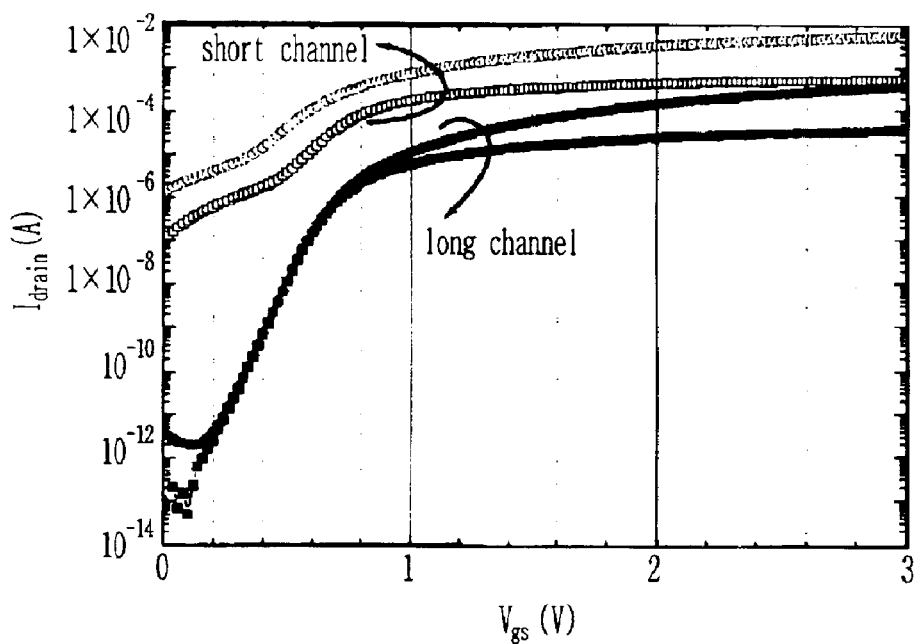
FIG. 1 is a graph showing a variation of a Idrain according to voltage difference (Vgs) between a gate and a source.
Figure 2:
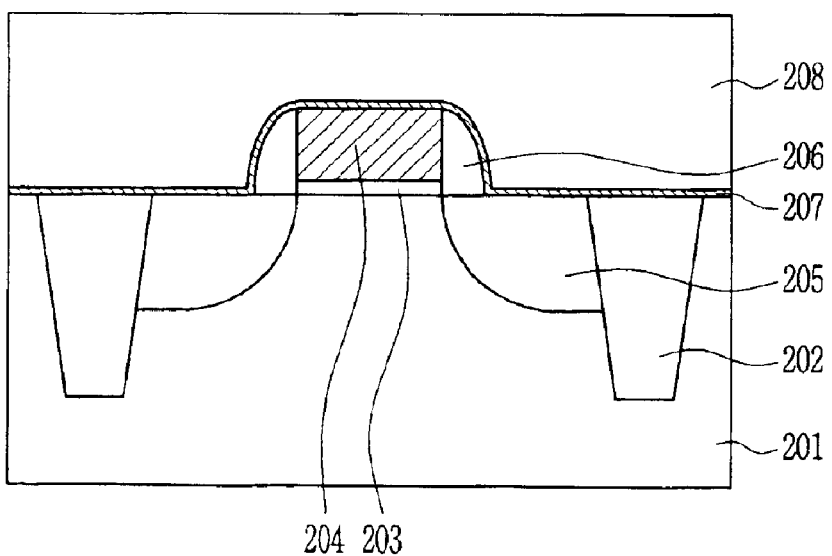
FIG. 2 is a cross-sectional view of a transistor according to one embodiment of a conventional art.
Figure 3:
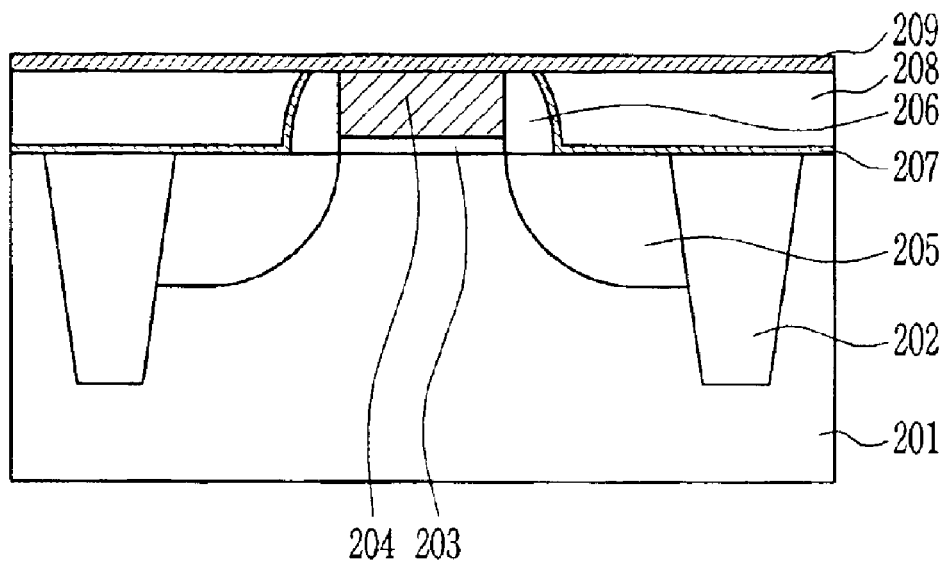
FIG. 3 is a cross-sectional view of a transistor according to another embodiment of a conventional art.
Figure 4:
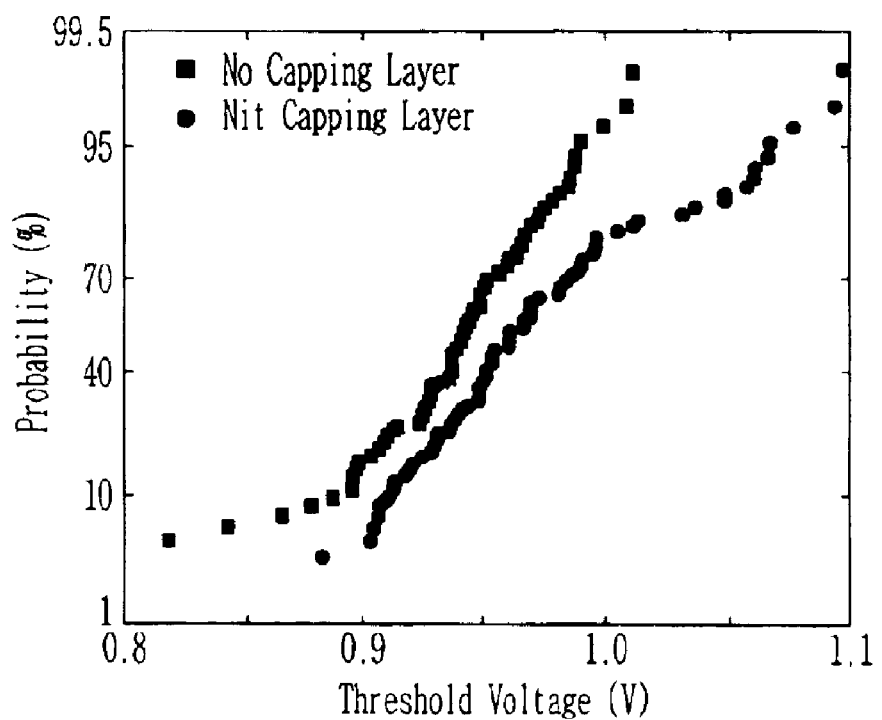
FIG. 4 is a graph showing how electrical characteristic of the transistor based on the threshold voltage variation is affected with a capping layer.
Figure 5:
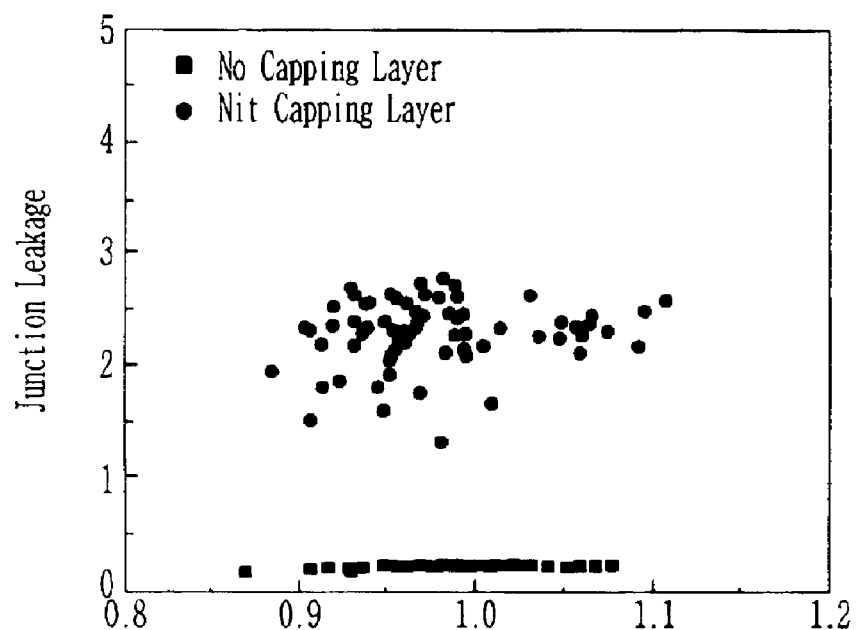
FIG. 5 is a graph showing how a leakage current characteristic is affected with a capping layer.

Now the preferred embodiments according to the present invention will be described with reference to accompanying drawings. Since preferred embodiments are provided for the purpose that the ordinary skilled in the art are able to understand the present invention, they may be modified in various manners and the scope of the present invention is not limited by the preferred embodiments described later.

Meanwhile, the same reference numerals in the figures denote the same or corresponding parts. In addition, a certain film may exist on the other film or the semiconductor substrate by contacting directly, or a third film may be intervened between them.

Figure 6A:
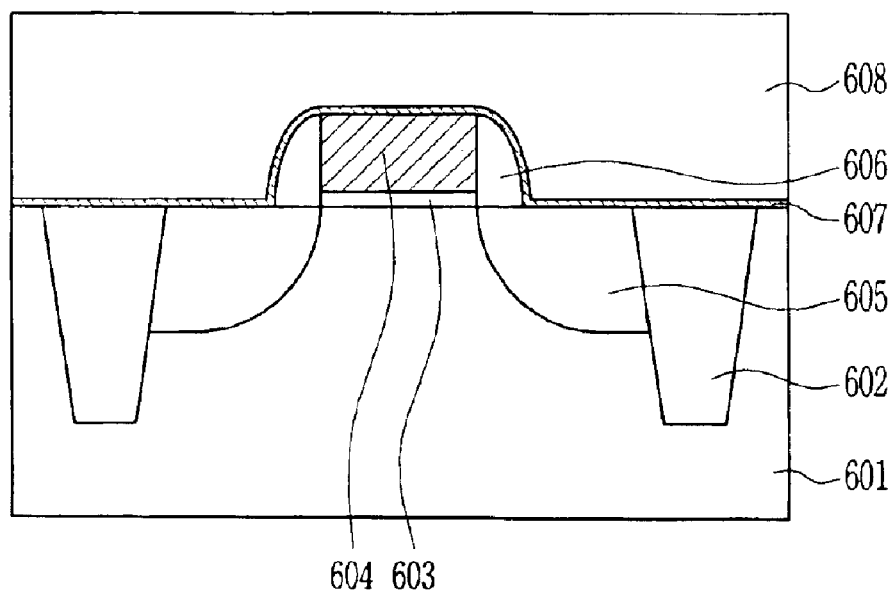
FIGS. 6A to 6C are cross-sectional views explaining a method for manufacturing a semiconductor device according to an embodiment of the present invention.
Figure 6B:
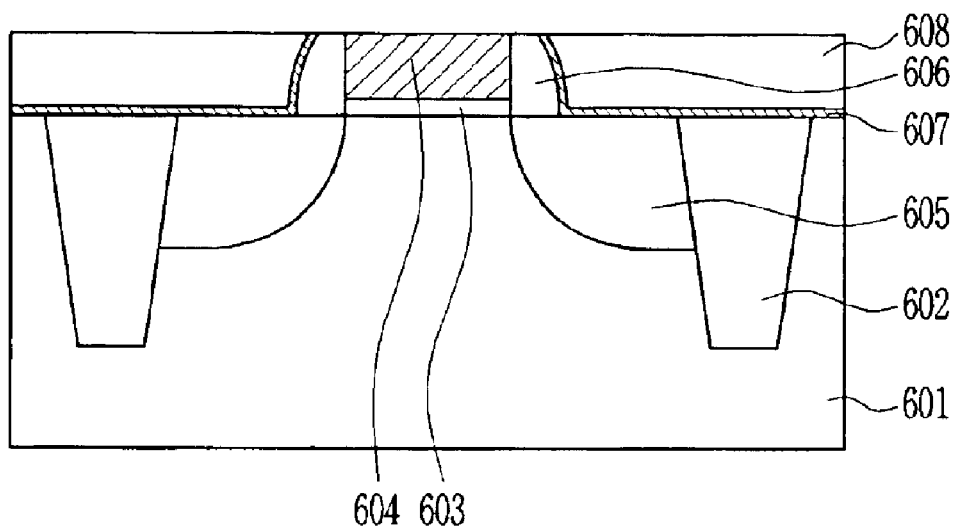
Figure 6C:
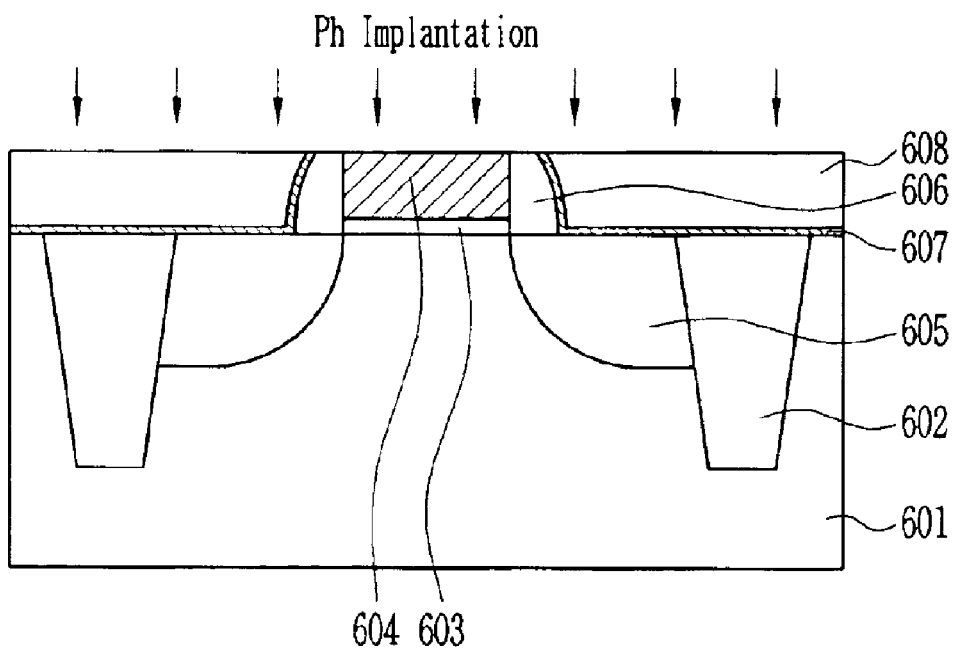

FIGS. 6A to 6C are cross-sectional views explaining a method for manufacturing a semiconductor device according to an embodiment of the present invention.

Referring to FIG. 6A, a device isolation film 602 is formed in a device isolation region of a semiconductor substrate 601 and a plurality of different semiconductor elements like a transistor are formed in an active region to form a semiconductor device. At this time, the transistor includes a gate oxide film 603, a gate 604, and a source/drain 605. Meanwhile, an insulation film spacer 606 is formed on the sidewalls of the gate 604. In general, the insulation film spacer 606 is formed to be a stacked structure having an oxide film and a nitride film, in which the nitride film is exposed to the outside.

After forming a plurality of different semiconductor elements including the transistor on the semiconductor substrate 601, an interlayer insulation film 608 is formed all over the upper part of the semiconductor substrate. During the process of forming the plurality of different semiconductor elements, before forming the interlayer insulation film 608, a diffusion protection film 607 is formed all over the upper part to prevent H or moisture included in the interlayer insulation film 608 from penetrating the semiconductor substrate 601. The diffusion protection film 607 could be formed using a film including a nitride like a silicon nitride film (SiN). Thus, the generation of the Hump phenomenon can be prevented by forming the diffusion protection film 607 between the interlayer insulation film 608 and the transistor.

Referring to FIG. 6B, subsequent to forming the interlayer insulation film 608, a chemical and mechanical polishing process is performed to remove a step that can be generated during forming the film such as the gate 604 on the substrate. Then, the interlayer insulation film 608 is formed to have the minimum thickness so that the aspect ratio of the contact hole is lowered in the subsequent process, resulting in the contact plug being formed readily. To this end, the chemical and mechanical polishing process is performed until the diffusion protection film (not shown) on the gate 604 is exposed.

However, it is not easy to control the target polishing thickness or the ending point of the chemical and mechanical polishing process. Accordingly, the diffusion protection film on the gate 604 is polished, thereby the surface of the gate 604 may be exposed. Although it is not significant for the surface of the gate 604 to be exposed, the upper part of the insulation film spacer 606 formed on sidewalls of the gate 604 is further polished for an inner oxide film to be exposed. Through the exposed oxide film, a mobile ion like H or moisture can penetrate from outside to a channel region.

Referring to FIG. 6C, a hole trap site (not shown) is formed in the interlayer insulation film 608 and the insulation film spacer 606 to prevent a mobile ion like H or moisture from penetrating thereof. There are various methods for forming the hole trap site, and one of the methods is an impurity implantation method. In this method, an ion implantation process can be performed without a mask since the impurity is implanted into the exposed upper surface of the interlayer insulation film 608 or the insulation film spacer 606.

More specifically, the hole trap site can be formed by implanting phosphorus (P) as an impurity into the interlayer insulation film 608. P ion implanted into the interlayer insulation film 608 combines with oxygen (O) ion included in the interlayer insulation film 608, and forms the hole trap site. As the amount of the implantation in P increases, the hole trap site increases and thus H can be prevented from penetrating thereof readily. Preferably, P is implanted into the interlayer insulation film 608 with a dose in the range of $3E15/cm^2$ to $7E15/cm^2$, taking into consideration the diffusion of P into the substrate or other process conditions.

In addition, ion implantation energy is controlled in the range of 10 keV to 30 keV and, preferably, controlled so that the implanted P ion is implanted into only the interlayer insulation film 608 or the oxide film of the insulation film spacer 606 without penetrating the semiconductor substrate 601.

Meanwhile, subsequent to implanting the impurity, a heat treatment process may be performed for combining the impurity ion with oxygen ion, but the temperature range is not limited. Once the heat treatment was performed to combine the impurity ion, there is no need for an additional heat treatment because the ion is combined automatically by the subsequent heat treatment.

It can be understood that the hole trap site is formed by the impurity implanted into the interlayer insulation film, by the phosphor-silicate-glass (PSG) film having the various trap sites.

Figures 7, 8:
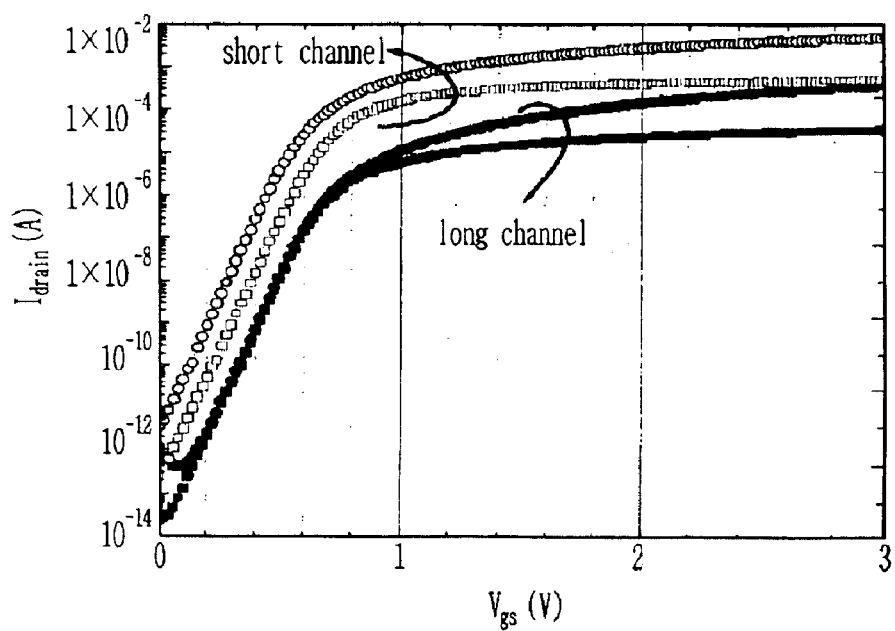
FIG. 7 shows various trap sites existing on phospho-silicate-glass (PSG) film.
FIG. 8 is a graph showing a variation of a drain current (Idrain) according to Vgs between a gate and a source.

FIG. 7 shows the various trap sites existing in PSG film.

Referring to FIG. 7, such a combination structure has been suggested in the following references and used by the skilled in the art commonly.

1. D. L. Griscom, E. J. Friebele, K. J. Long, and J. W. Fleming, "Fundamental defect centers in glass:Electron spin resonance and optical absorption studies of irradiated phosphorous-doped silica glass and optical fibers,", J. Appl. Phys., Vol. 43, pp.960–967, 1976.

2. D. L. Griscom, G. H. Sigel Jr., and R. J. Gingther, "Defect centers in a pure-silica core borosilicate-clad optical fiber: ESR studies", J. Appl. Phys., Vol. 54, pp.3743–3762, 1983.

3. Patrick M. Lenahen and Curtis A. Billman, Robert Fuller, Howard Evans William H. Speece, David DeCrosta, and Robert Lowry, "A Study of Charge Trapping in PECVD PTEOS Films", IEEE Trans. Nucl. Sci., Vol. 44, pp. 1834–1839, 1997.

The PSG film has been used in the various damage gettering processes by using the hole trap characteristic as described above. However, it is not preferable that the PSG film deposition process under the high temperature is performed in a post process following the performance of a device element process, in the case of the semiconductor DRAM process. Furthermore, if PSG film is used as an insulation film spacer on the gate sidewall, P may be diffused into Si bulk and, as a result, the device characteristic could be deteriorated.

However, according to the present invention, it is possible to selectively form the hole trap in the desired region such as the gate sidewall or the region apart from the Si bulk, by implanting the impurity to form the hole trap site with the ion implantation process after forming the interlayer insulation film with the oxide-based material capable of the low temperature process, without using PSG film as an interlayer insulation film.

FIG. 8 is a graph showing a variation of a drain current (Idrain) according to voltage difference (Vgs) between a gate/a source.

Referring to FIG. 8, it is noted that the Idrain decreases drastically if Vgs comes to be lower than a certain voltage (e.g. the threshold voltage) regardless of the channel length, by preventing a mobile ion or moisture from penetrating the substrate by forming the hole trap site in the interlayer insulation film. As a result, the Hump phenomenon that the leakage current is generated where the voltage difference (Vgs) is lower than the threshold voltage is not generated.

As described above, according to the present invention, by forming the hole trap site in the interlayer insulation film capable of preventing a mobile ion like H or moisture from penetrating thereof, the leakage current is prevented from being increased abnormally where the voltage difference (Vgs) is lower than the threshold voltage, and thus electric characteristics of the device and credibility can be improved.

What is claimed is:

1. A method for manufacturing a semiconductor device comprising the steps of;

preparing a semiconductor substrate on which a gate and an insulating film spacer for a transistor are formed;

forming a PE-TEOS interlayer insulating film all over the upper part of the semiconductor substrate;

polishing the PE-TEOS interlayer film, and so that a portion of the insulating film spacer is exposed; and implanting phosphorus ion into the polished PE-TEOS interlayer insulating film and the exposed insulating film spacer to form a hole trap site capable of preventing a movable ion or moisture from penetrating the PE-TEOS interlayer insulating film and the insulation film spacer.

2. The method of claim 1, before forming the PE-TEOS interlayer insulating film, further comprising a step of forming a diffusion protection film all over the upper part of the semiconductor substrate.

3. The method of claim 1, wherein the phosphorus ion is implanted with a dose in the range of $3E15/cm^2$ to $7E15/cm^2$.

4. The method of claim 1, wherein the phosphorus ion is implanted into the PE-TEOS interlayer insulating film and the insulation film spacer with ion implantation energy in the range of 10 keV to 30 keV.

5. A method for manufacturing a semiconductor device comprising tho steps of;

preparing a semiconductor substrate on which gate and an insulating film spacer for a transistor are formed;

forming a PE-TEOS interlayer insulating film all over the upper part of the semiconductor substrate;

polishing the PE-TEOS interlayer film, and so that a portion of the insulating film spacer is exposed; and implanting impurity into the formed PE-TEOS film and the insulating film spacer to form a hole trap site capable of preventing a movable ion or moisture from penetrating the PE-TEOS interlayer insulating film and the insulation film spacer.

6. The method of claim 5, before forming the PE-TEOS interlayer insulating film, further comprising a step of forming a diffusion protection film all over the upper part of the semiconductor substrate.

7. The method of claim 5, wherein the impurity is implanted with a dose in the range of $3E15/cm^2$ to $7E15/cm^2$.

8. The method of claim 5, wherein the impurity is implanted with ion implantation energy in the range of 10 keV to 30 keV.

9. The method of claim 5, wherein the impurity is implanted using phosphorus (P) ion.

* * * * *

UNITED STATES PATENT AND TRADEMARK OFFICE
CERTIFICATE OF CORRECTION

PATENT NO.        : 6,943,125 B2                                        Page 1 of 1
APPLICATION NO. : 10/739248
DATED             : September 13, 2005
INVENTOR(S)       : Ga Won Lee et al.

It is certified that error appears in the above-identified patent and that said Letters Patent is hereby corrected as shown below:

Column 6, Line 30, delete "tho" and insert "the".

Signed and Sealed this

Eighth Day of August, 2006

JON W. DUDAS
*Director of the United States Patent and Trademark Office*